US006944558B2

(12) United States Patent
Hildebrant

(10) Patent No.: US 6,944,558 B2
(45) Date of Patent: Sep. 13, 2005

(54) METHODS AND APPARATUS FOR OPTIMIZING THE MASKING OF WAVEFORMS TO REDUCE THE NUMBER OF WAVEFORMS IN A LIST OF WAVEFORMS

(75) Inventor: Andrew Steven Hildebrant, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/686,376

(22) Filed: Oct. 14, 2003

(65) Prior Publication Data

US 2005/0080573 A1 Apr. 14, 2005

(51) Int. Cl.[7] .............................................. G01R 13/00
(52) U.S. Cl. ......................... 702/66; 714/742; 714/726; 714/723
(58) Field of Search ............................ 702/66–71, 108, 702/122; 714/723, 726, 742, 735; 324/763; 370/493–495, 503, 468, 508–510, 512, 516; 342/26, 28, 104, 107, 109, 113–115, 118, 134, 139, 146, 147, 175, 195, 101, 159, 202–204; 455/295, 296, 63.1, 302–306; 375/220, 219

(56) References Cited

U.S. PATENT DOCUMENTS

| | | | |
|---|---|---|---|
| 5,052,024 A | 9/1991 | Moran, III et al. | |
| 5,748,124 A | 5/1998 | Rosenthal et al. | |
| 5,996,098 A | 11/1999 | Takano | |
| 6,360,180 B1 | 3/2002 | Breger | |
| 6,381,728 B1 | 4/2002 | Kang | |
| 6,397,173 B1 | 5/2002 | Campbell et al. | |
| 6,512,989 B1 | 1/2003 | Deome et al. | |
| 6,718,503 B1 | 4/2004 | Lerner et al. | |
| 6,804,620 B1 | 10/2004 | Larson et al. | |
| 2003/0033099 A1 | 2/2003 | Sherlock | |
| 2003/0093731 A1 | 5/2003 | Whannel et al. | |
| 2004/0255214 A1 * | 12/2004 | Hildebrant | 714/742 |

OTHER PUBLICATIONS

Andrew Steven Hildebrant, "Systems and Methods for Testing Performance of an Electronic Device", Jun. 12, 2003, U.S. Appl. No. 10/461,252, 13 Pages of specification and Seven– (7) sheets of drawings (Figs. 1–7).

Andrew Steven Hildebrant, "Methods and Apparatus for Optimizing Lists of Waveforms", Filed Oct. 14, 2003, New U.S. Patent Application, 18 pages of specification and three– (3) sheets of drawings (Figs. 1–9).

* cited by examiner

Primary Examiner—Carol S. W. Tsai

(57) ABSTRACT

A list of waveforms is received (the list being one that is to be driven to or received from a pin of a device under test, and each waveform in the list being associated with a weight). For each of at least two waveforms in the list, a number of test sample points lost by masking the waveform with a particular parent waveform in a child-parent waveform map is calculated. The number of lost test sample points is determined by 1) a difference in the number of test sample points in the waveform and the number of test sample points in the particular parent waveform, and 2) the weight associated with the waveform. In response to the calculations, a waveform masking is implemented such that the implemented waveform masking results in fewer lost test sample points than another waveform masking.

24 Claims, 3 Drawing Sheets

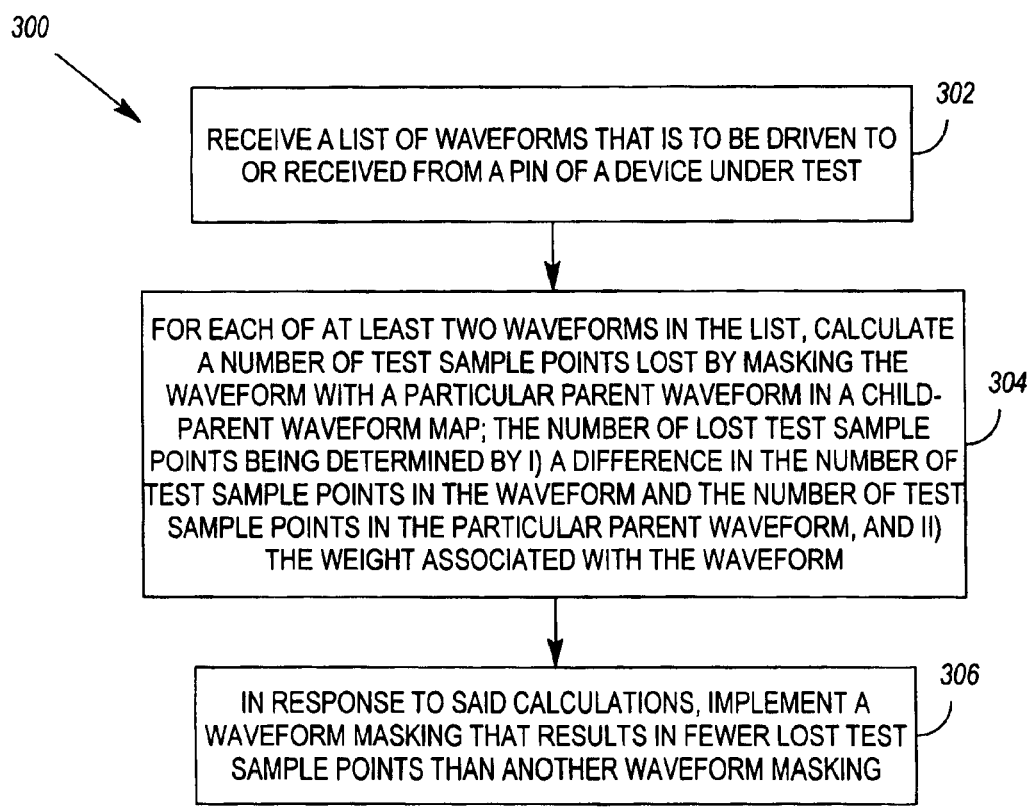

US 6,944,558 B2

METHODS AND APPARATUS FOR OPTIMIZING THE MASKING OF WAVEFORMS TO REDUCE THE NUMBER OF WAVEFORMS IN A LIST OF WAVEFORMS

BACKGROUND OF THE INVENTION

Electronic devices are often tested by generating a plurality of input patterns for the pins of a device under test, applying the input patterns to the device under test, capturing output patterns from the device under test, and then comparing the captured output patterns (or device vectors corresponding thereto) to expected output patterns or vectors.

Each of the afore-mentioned patterns comprises a plurality of sequential states. These states may take a variety of forms, such as logic one (1), logic zero (0), high (H), low (L), or don't care (X).

For some circuit testers, input patterns and expected output patterns are stored in pattern memory as sequences of smaller patterns (e.g., smaller patterns comprising three sequential states of the original pattern); and waveforms corresponding to these smaller patterns are stored in high-speed waveform memories. The patterns stored in the pattern memories are then used to address the waveforms stored in the waveform memories.

Due to the high-speed nature of the waveform memories, these memories are often too small to hold waveforms corresponding to all "potential" patterns stored in pattern memory. Decisions therefore need to be made regarding which waveforms to store in each waveform memory. The United States patent application of Hildebrant entitled "Systems and Methods for Testing Performance of an Electronic Device" (Ser. No. 10/461,252 filed Jun. 12, 2003, hereby incorporated by reference) discloses systems and methods for 1) examining the "actual" patterns that are to be stored in a pattern memory to discern which unique combinations of states are actually found therein, and then 2) using this information as a basis for determining which waveforms should be stored in a corresponding waveform memory.

Sometimes, even the methods and apparatus disclosed in the above-incorporated patent application are insufficient to distill a list of waveforms down to a number of waveforms that are capable of being stored in a waveform memory. Choices therefore need to be made regarding which waveforms should be eliminated. However, eliminating waveforms can reduce the fault coverage of a particular test suite or testflow. Further, it is sometimes (even often) not intuitive which waveforms are the best candidates for elimination.

SUMMARY OF THE INVENTION

In one embodiment of the invention, a method comprises receiving a list of waveforms that is to be driven to or received from a pin of a device under test. Each waveform in the list is associated with a weight. For each of at least two waveforms in the list, a number of test sample points lost by masking the waveform with a particular parent waveform in a child-parent waveform map is calculated. The number of lost test sample points is determined by 1) a difference in the number of test sample points in the waveform and the number of test sample points in the particular parent waveform, and 2) the weight associated with the waveform. In response to the calculations, a waveform masking is implemented such that the implemented waveform masking results in fewer lost test sample points than another waveform masking.

Other embodiments of the invention are also disclosed.

BRIEF DESCRIPTION OF THE DRAWINGS

Illustrative and presently preferred embodiments of the invention are illustrated in the drawings, in which:

FIG. 2 illustrates a first exemplary list of waveforms;

FIG. 3 illustrates an exemplary method for optimizing the masking of waveforms;

DESCRIPTION OF THE PREFERRED EMBODIMENT

Figure 1:
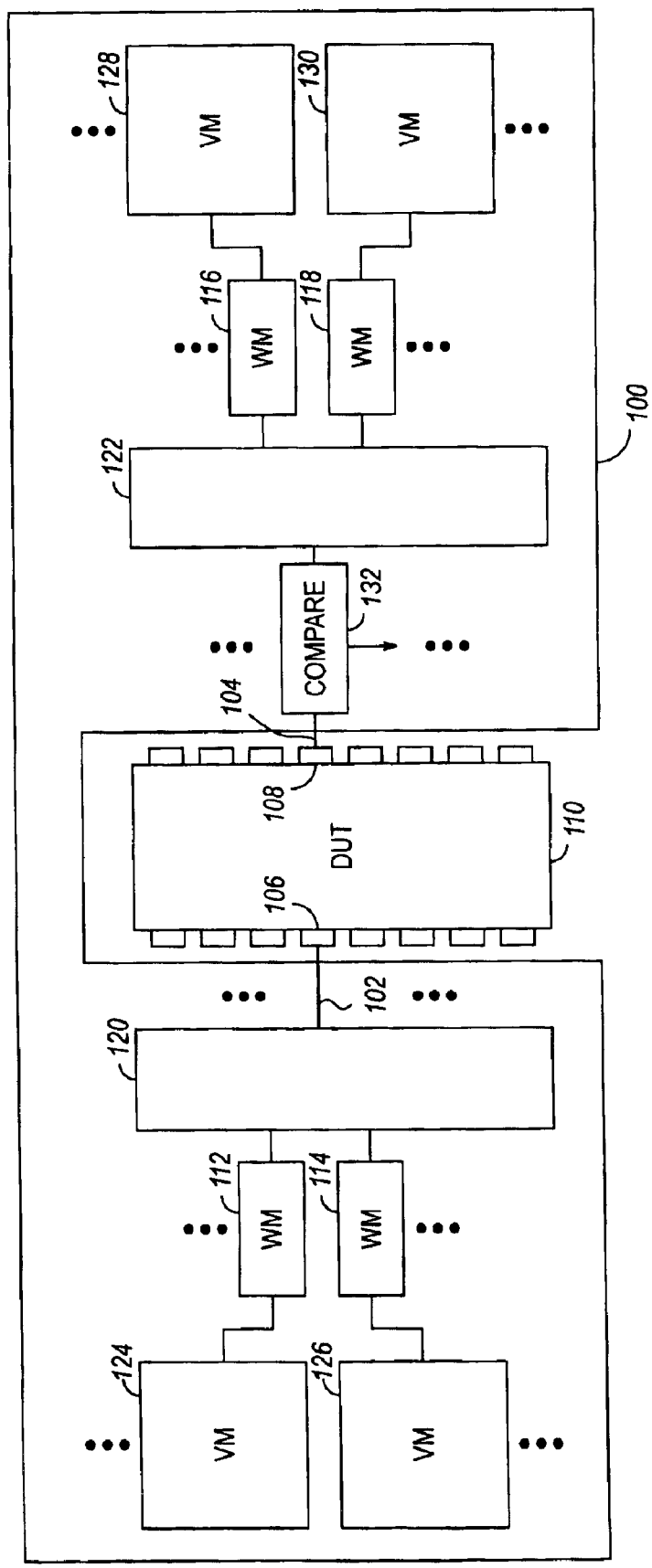
FIG. 1 illustrates an exemplary circuit tester.

FIG. 1 illustrates a circuit tester 100 comprising a plurality of driving probes 102 and receiving probes 104. During circuit test, these probes 102, 104 are variously coupled to the input and output pins 106, 108 of a device under test (DUT 110). The circuit tester 100 further comprises a plurality of waveform memories 112, 114, 116, 118, coupled to the plurality of probes 102, 104 via a pair of networks 120, 122. The networks 120, 122 may be nothing more than systems of wires that couple the waveform memories 112–118 to probes 102, 104 in a one-to-one correspondence; or the networks 120, 122 may be switching networks that are capable of coupling the waveform memories 112–118 to different ones of the probes 102, 104. If implemented as switching networks, the networks 120, 122 may also couple plural ones of the waveform memories 112–118 to a single probe (e.g., as discussed in the United States patent application of Hildebrant entitled "Methods and Apparatus for Optimizing Lists of Waveforms", Ser. No. 10/685,885, filed on the same date as this application and hereby incorporated by reference).

The circuit tester 100 may also comprise a plurality of pattern memories 124, 126, 128, 130 from which data is read to address the waveform memories 112–118. On the receiving side of the circuit tester 100, circuitry 132 may be provided for comparing expected waveforms for the DUT 110 to actual waveforms received from the DUT 110.

The circuit tester 100 may be programmed as follows. First, software and/or a test designer generates a plurality of test vectors for the DUT 110. The test vectors are then converted to a plurality of test patterns, each of which comprises a plurality of states (e.g., logic one (1), logic zero (0), high (H), low (L), or don't care (X)) that are to be sequentially applied to a particular pin of the DUT 110. Each test pattern is then segmented into a number of sequential N-bit patterns. Theoretically, each of these N-bit patterns should then be stored in a pattern memory of the circuit tester 100, and unique ones of the N-bit patterns should be stored as waveforms in a corresponding waveform memory (e.g., as taught in the United States patent application of Hildebrant entitled "Systems and Methods for Testing Performance of an Electronic Device", referenced supra). The N-bit patterns are then sequentially read from the pattern memory to address corresponding waveforms stored in the waveform memory. As each waveform is addressed, its states are output to the DUT 110.

As the frequencies at which DUTs need to be tested increase, there is pressure on engineers and manufactures to increase the speeds at which waveform memories 112–118 operate. However, the necessary construction parameters of high speed waveform memories make them difficult and expensive to build. As result, they are often of a relatively small size. For example, a pattern memory of the circuit tester 100 may be capable of storing many thousands of N-bit patterns, while its corresponding waveform memory may be limited to a much smaller number of entries (e.g., 32 entries).

If a waveform comprises 5-bits, and each one of its bits may assume one of three different states (e.g., H, L or X), the 5-bit waveform may take one of 243 different forms. Increasing the size of a waveform to 6 bits and increasing the number of possible states to five increases the number of potential waveforms to 15,625. Thus, it doesn't take many bits or many states to greatly outstrip the storage capability of a small (e.g., 32-bit) waveform memory. Also, different state magnitudes, timing, and other factors can further increase the number of potential waveforms that might need to be stored in a waveform memory.

Fortunately, the repetitive nature of most test patterns often translates to only a small subset of potential N-bit waveforms actually appearing in a given test pattern. However, even these smaller subsets of waveforms have a tendency to exceed the storage capabilities of waveform memories, thus requiring the elimination (or masking) of some of the waveforms that are extracted from a test pattern.

Since waveform masking results in test sample points (e.g., certain states, edges or magnitudes) being lost, and since some waveform maskings result in more test sample points being lost than others, careful choices should be made regarding which of a number of waveform maskings to implement. Sometimes (even often), it is not intuitive which waveforms are the best candidates for masking.

One way to determine which waveforms to mask is to associate each waveform in a list of waveforms 200 with a weight (see FIG. 2). The weights may then be used to determine which waveforms appear less frequently, and are thus better candidates for masking.

When associating waveforms with weights, various weighting schemes may be used. For example, the number of times a waveform is encountered in a test pattern may be tracked, and this number may then be assigned to the waveform as its "statistical weight". Or, for example, the importance of a waveform being preserved is determined, and is assigned to the waveform as its "priority weight." A waveform may be deemed to have a greater priority because, for example, it is the only waveform (or one of a few) that exposes a particular fault. A waveform may also be deemed to have a greater priority because it toggles more device gates. In the latter case, it may be desirable to consider each edge (or transition) in a waveform, as masking the waveform to another may preserve certain states, but eliminate critical edges.

Consider the three weighted waveforms shown in FIG. 2. One potential waveform masking is HLL->XXX. This masking eliminates the fewest number of waveforms. However, considering states alone, the masking drops 24 test sample points. A better masking would actually be HXX->XXX. Although this masking drops more waveforms, it drops only 21 test sample points. However, while not intuitively obvious, an even better masking is HLL->HXX, which drops only 16 test sample points. As the number and complexity of waveforms increases, it becomes too difficult for a human to spot and implement non-intuitive but optimal maskings. FIG. 3 therefore illustrates a new method 300 for optimizing waveform masking.

The method 300 commences with the receipt 302 of a list of waveforms. Each of the waveforms in the list is meant to be driven to or received from a pin of a DUT, and each waveform is associated with a weight, as shown in FIG. 2.

For each of at least two waveforms in the list, the method 300 calculates 304 a number of test sample points lost by masking the waveform with a particular parent waveform in a child-parent waveform map.

Figure 4:
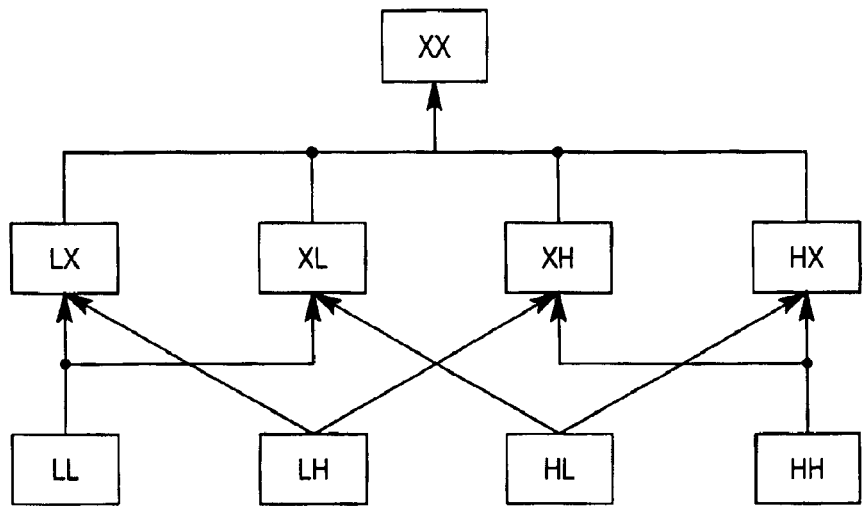
FIG. 4 illustrates an exemplary child-parent waveform map.

An exemplary 2-bit child-parent waveform map is shown in FIG. 4. Note that parent node XX has four child nodes (i.e., LX, XL, XH, HX), and each of these child nodes is a parent for two additional child nodes (e.g., node LX is the parent of nodes LL and LH). Also, some child nodes have more parent nodes than others (e.g., node LL has parents LX and XL, while node LX only has parent XX).

A child-parent waveform map is useful in that it indicates the number of generations between two particular nodes, and is thus indicative of the number of test sample points that are lost in masking a waveform with a parent waveform. This information, in combination with the weight associated with a waveform that is to be masked, enables the method 300 to determine how many total test sample points will be lost by implementing a particular waveform masking. If this calculation is performed for at least two different waveform maskings (and preferably all possible waveform maskings), the method 300 may then implement 306 a waveform masking that results in fewer lost test sample points than another waveform masking. Or, a waveform masking that results in a fewest lost test sample points may be implemented.

Figure 5:
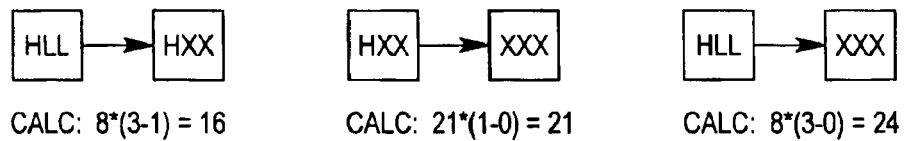
FIG. 5 illustrates an exemplary application of the FIG. 3 method to the FIG. 2 list of waveforms.

FIG. 5 illustrates exemplary calculations for each of the child-parent waveform relationships in the list of waveforms shown in FIG. 2. Each calculation multiplies 1) the weight of a waveform to be masked by 2) the difference in the number of test sample points of the waveform and a given parent waveform. After performing each calculation, it becomes clear that HLL->HXX is the preferred masking.

If a waveform comprises N test sample points, a child-parent waveform map may comprise all combinations of the N test sample points or only those combinations that actually appear in a particular waveform list. Regardless, in one embodiment of the method 300, waveforms in a list are only masked with parent waveforms found in the list.

Figure 6:
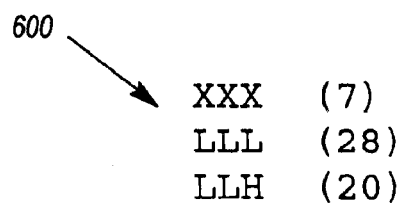
FIG. 6 illustrates a second exemplary list of waveforms.

In another embodiment of the method 300, waveforms in a list may be masked with parent waveforms that were previously not in the list. That is, the method 300 may calculate the number of test sample points lost by masking each of two or more waveforms in a list with a parent waveform that is not in the list. Then, each of the two or more waveforms in the list may be masked by this parent waveform if either 1) the two or more waveform maskings, in combination, result in fewer lost test sample points than another single waveform masking, or 2) the two or more waveform maskings, in combination, result in fewer lost test sample points than another two or more waveform maskings. For example, refer to the waveform list 600 shown in FIG. 6. When method 300 is limited to masking waveforms in the list 600 to other waveforms in the list, the best masking choice is LLH->XXX, which drops only 60 test sample points. However, if two or more waveforms in the list may be masked to a waveform that is not yet in the list, a better "pair" of maskings would be LLH->LLX and LLL->LLX (which only drops 48 test sample points).

In response to the calculations performed by the method 300, a number of waveform maskings may be implemented to distill the number of waveforms in a list down to a number of waveforms that can be stored in a particular waveform memory of a circuit tester. This may be done, for example, by performing calculations once, and then implementing one or more waveform maskings in response to one set of calculations. Or, calculations and waveform maskings may be repeated in an iterative process. It may also be beneficial to choose a plurality of waveform maskings in response to only one set of calculations, thereby choosing a number of waveform maskings that, together, minimize lost test sample points (i.e., a parallel optimization may be implemented). If this latter method is used to choose waveform maskings, a simultaneous matrix analysis may be used to choose the set of waveform maskings.

After the implementation of each waveform masking, the weights of two or more waveforms involved in a masking may be combined, and then associated with the parent waveform involved in the masking. In this manner, additional maskings may be based on a new set of weights.

The above-described methods may be embodied in program code stored on a number of computer readable media. By way of example, the program code may take any of a variety of forms, including object code, machine code, or code embedded in an EEPROM. Likewise, the computer readable media may take any of a variety of forms, including optical discs, computer memory, a fixed disk, server storage, RAM or ROM.

If any of the methods described herein are embodied in program code, the, program code may define an interface to receive the list of waveforms that is to be driven to or received from a pin of a device under test. The program code may further comprise code to, for each of at least two waveforms in the list, calculate a number of test sample points lost by masking the waveform with a particular parent waveform in a child-parent waveform map. The number of lost test sample points may be determined by 1) a difference in the number of test sample points in the waveform and the number of test sample points in the particular parent waveform, and 2) a weight associated with the waveform. The program code may also comprise code to, in response to the aforementioned calculations, implement a waveform masking that results in fewer lost test sample points than another waveform masking.

In one embodiment of the program code, the child-parent waveform map is included within the code. However, the child-parent waveform map could also be dynamically generated by the code, or portions of the child-parent waveform map could be inferred based on the number and relation of test sample points actually found in two particular waveforms.

As previously described in the context of the method 300, the code that implements waveform maskings may implement a number of waveform maskings until the number of waveforms in a list is distilled down to a number of waveforms that can be stored in a particular waveform memory of a circuit tester. Also, the code that performs the calculations and the code that implements waveform maskings may be called in an iterative process.

If one or more of the methods described herein is embodied in program code, the program code may be sold or delivered by means of its own computer readable media (e.g., an optical disc), or by integrating the program code with (or installing the program code on) a circuit tester such as that which is shown in FIG. 1. Also, it should be noted that the particular circuit tester shown in FIG. 1 is exemplary only, and the novel methods and apparatus disclosed herein may be used in conjunction with other testers, some of which may have alternate memory structures, architectures, and/or operational modes.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method, comprising:
   receiving a list of waveforms that is to be driven to or received from a pin of a device under test; each waveform being associated with a weight;
   for each of at least two waveforms in the list, calculating a number of test sample points lost by masking the waveform with a particular parent waveform in a child-parent waveform map; the number of lost test sample points being determined by i) a difference in the number of test sample points in the waveform and the number of test sample points in the particular parent waveform, and ii) the weight associated with the waveform; and
   in response to said calculations, implementing a waveform masking that results in fewer lost test sample points than another waveform masking.

2. The method of claim 1, wherein the weights are statistical weights.

3. The method of claim 1, wherein the weights are priority weights.

4. The method of claim 1, wherein each waveform in the list comprises N test sample points, and wherein the child-parent waveform map comprises all combinations of the N test sample points, regardless of whether all combinations are found in the list.

5. The method of claim 4, wherein waveforms in the list are only masked with parent waveforms in the list.

6. The method of claim 4, wherein in response to said calculations, two or more waveforms in the list are masked with a common parent waveform that was previously not in the list; wherein the two or more waveform maskings, in combination, result in fewer lost test sample points than another single waveform masking.

7. The method of claim 4, wherein in response to said calculations, two or more waveforms in the list are masked with a common parent waveform that was previously not in the list; wherein the two or more waveform maskings, in combination, result in fewer lost test sample points than another two or more waveform maskings.

8. The method of claim 1, wherein in response to said calculations, a waveform masking that results in a fewest lost test sample points is implemented.

9. The method of claim 1, wherein in response to said calculations, a number of waveform maskings are implemented; said number of waveform maskings being chosen to distill the number of waveforms in the list to a number of waveforms that can be stored in a particular waveform memory of a circuit tester.

10. The method of claim 1, wherein said calculations and waveform masking are repeated in an iterative process.

11. The method of claim 1, wherein in response to said calculations, a plurality of waveform maskings are implemented; said waveform maskings being chosen to, together, minimize lost test sample points.

12. The method of claim 11, wherein said calculations are performed using a simultaneous matrix analysis.

13. The method of claim 1, further comprising, with the implementation of each waveform masking, combining the weights of the two or more waveforms involved in the masking, and associating the combined weight with the parent waveform.

14. Apparatus, comprising:

a number of computer readable media; and program code, stored on the computer readable media, defining:

an interface to receive a list of waveforms that is to be driven to or received from a pin of a device under test; each waveform being associated with a weight;

code to, for each of at least two waveforms in the list, calculate a number of test sample points lost by masking the waveform with a particular parent waveform in a child-parent waveform map; the number of lost test sample points being determined by i) a difference in the number of test sample points in the waveform and the number of test sample points in the particular parent waveform, and ii) the weight associated with the waveform; and code to, in response to said calculations, implement a waveform masking that results in fewer lost test sample points than another waveform masking.

15. The apparatus of claim 14, wherein the program code further comprises the child-parent waveform map; wherein each waveform in the list comprises N test sample points; and wherein the child-parent waveform map comprises all combinations of the N test sample points, regardless of whether all combinations are found in the list.

16. The apparatus of claim 14, wherein the program code only masks waveforms in the list with parent waveforms in the list.

17. The apparatus of claim 14, wherein in response to said calculations, the code that implements waveform maskings is able to mask two or more waveforms in the list with a common parent waveform that was previously not in the list; and wherein the two or more waveform maskings, in combination, result in fewer lost test sample points than another single waveform masking.

18. The apparatus of claim 14, wherein in response to said calculations, the code that implements waveform maskings is able to mask two or more waveforms in the list with a common parent waveform that was previously not in the list; and wherein the two or more waveform maskings, in combination, result in fewer lost test sample points than another two or more waveform maskings.

19. The apparatus of claim 14, wherein in response to said calculations, the code that implements waveform maskings implements a number of waveform maskings, until the number of waveforms in the list is distilled to a number of waveforms that can be stored in a particular waveform memory of a circuit tester.

20. The apparatus of claim 14, wherein the code that performs said calculations and the code that implements waveform maskings are called in an iterative process.

21. The apparatus of claim 14, wherein in response to said calculations, the code that implements waveform maskings implements a plurality of waveform maskings; said waveform maskings being chosen to, together, minimize lost test sample points.

22. The apparatus of claim 21, wherein the code that performs said calculations conducts a simultaneous matrix analysis.

23. A circuit tester, comprising:

a plurality of driving probes and receiving probes;

a plurality of waveform memories;

means to associate said waveform memories with ones of said probes;

an interface to receive lists of waveforms that are to be driven to and received from said probes; each waveform being associated with a weight;

program code to, for each of at least two waveforms in a given list, calculate a number of test sample points lost by masking the waveform with a particular parent waveform in a child-parent waveform map; the number of lost test sample points being determined by i) a difference in the number of test sample points in the waveform and the number of test sample points in the particular parent waveform, and ii) the weight associated with the waveform;

program code to, in response to said calculations, implement a waveform masking that results in fewer lost test sample points than another waveform masking; and program code to, after one or more waveform maskings have been implemented in one or more of the lists of waveforms, program ones of the waveform memories with waveforms remaining in the lists.

24. The circuit tester of claim 23, wherein in response to said calculations, the code that implements waveform maskings implements a number of waveform maskings in a particular list of waveforms, until the number of waveforms in the particular list is distilled to a number of waveforms that can be stored in a particular waveform memory of the circuit tester.

* * * * *

UNITED STATES PATENT AND TRADEMARK OFFICE
CERTIFICATE OF CORRECTION

PATENT NO. : 6,944,558 B2
APPLICATION NO. : 10/686376
DATED : September 13, 2005
INVENTOR(S) : Hildebrant It is certified that error appears in the above-identified patent and that said Letters Patent is hereby corrected as shown below:

On the face page, in field (56), under "U.S. Patent Documents", in column 1, line 1, delete "5,052,024 A  9/1991 Moran, III et al." and insert - -5,052,024 * 9/1991 Moran et al. 375/219 - -, therefor.

On the face page, in field (56), under "U.S. Patent Documents", in column 1, line 3, delete "5,996,098 A  11/1999 Takano" and insert - -5,996,098 * 11/1999 Takano 714/723 - -, therefor.

On the face page, in field (56), under "U.S. Patent Documents", in column 1, line 4, delete "6,360,180 B1  3/2002 Breger" and insert - - 6,360,180 * 3/2002 Breger 702/108 - -, therefor.

On the face page, in field (56), under "U.S. Patent Documents", in column 2, line 3 delete "6,512,989 B1  1/2003 Deome et al." and insert - -6,512,989 * 1/2003 Deome et al. 702/124 - -, therefor.

On the face page, in field (56), under "U.S. Patent Documents", in column 2, line 5, delete "6,804,620 B1  10/2004 Larson et al." and insert - - 6,804,620 * 10/2004 Larson et al. 702/91 - -, therefor.

On the face page, in field (56), under "U.S. Patent Documents", in column 2, line 6, delete "2003/0033099 A1 2/2003 Sherlock" and insert - - 2003/0033099 * 2/2003 Sherlock 702/66 - -, therefor.

UNITED STATES PATENT AND TRADEMARK OFFICE
CERTIFICATE OF CORRECTION

PATENT NO.         : 6,944,558 B2
APPLICATION NO. : 10/686376
DATED              : September 13, 2005
INVENTOR(S)       : Hildebrant It is certified that error appears in the above-identified patent and that said Letters Patent is hereby corrected as shown below:

On the face page, in field (56), under "U.S. Patent Documents", in column 2, line 7, delete "2003/0093731 A1 5/2003 Whannel et al." and insert - - 2003/0093731 * 5/2003 Whannel et al. 714/726 - -, therefor.

Signed and Sealed this

First Day of August, 2006

JON W. DUDAS
*Director of the United States Patent and Trademark Office*